US007680216B2

(12) United States Patent
Datta et al.

(10) Patent No.: US 7,680,216 B2
(45) Date of Patent: Mar. 16, 2010

(54) ADAPTIVE THRESHOLDS FOR HIGH SPEED DOWNLINK SHARED CONTROL CHANNEL (HS-SCCH) (PART I) DETECTION SCHEMES

(75) Inventors: Suparna Datta, Burlington, MA (US); Anand G. Dabak, Plano, TX (US); Timothy M. Schmidl, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1649 days.

(21) Appl. No.: 10/408,941

(22) Filed: Apr. 8, 2003

(65) Prior Publication Data
US 2004/0001428 A1  Jan. 1, 2004

Related U.S. Application Data

(60) Provisional application No. 60/392,769, filed on Jul. 1, 2002.

(51) Int. Cl.
*H04L 25/06* (2006.01)
(52) U.S. Cl. ...................... 375/317; 714/758

(58) Field of Classification Search .......... 375/317; 714/758
See application file for complete search history.

(56) References Cited

U.S. PATENT DOCUMENTS

| 5,909,471 | A * | 6/1999 | Yun ........................ 375/343 |
| 6,885,988 | B2 * | 4/2005 | Chen ....................... 704/228 |
| 6,973,579 | B2 * | 12/2005 | Dick et al. ................ 375/135 |
| 7,158,635 | B2 * | 1/2007 | Dick et al. ................ 380/28 |
| 2003/0192003 | A1 * | 10/2003 | Das et al. .................. 714/758 |

* cited by examiner

*Primary Examiner*—Juan A Torres
(74) *Attorney, Agent, or Firm*—Ronald O. Neerings; Wade James Brady, III; Frederick J. Telecky, Jr.

(57) ABSTRACT

A technique is provided for implementing adaptive thresholds associated with HS-SCCH detection schemes; and when applied to any HS-SCCH detection scheme, the resulting false alarm probability curves are more robust to amplitude variations of the different shared control channels. The technique has low computational complexity and low storage requirements for the estimator. Such lower complexity detection schemes have been found to outperform more complex schemes when adaptive thresholds are applied.

9 Claims, 2 Drawing Sheets

ADAPTIVE THRESHOLDS FOR HIGH SPEED DOWNLINK SHARED CONTROL CHANNEL (HS-SCCH) (PART I) DETECTION SCHEMES

CLAIM TO PRIORITY OF PROVISIONAL APPLICATION

The application claims priority under 35 U.S.C. §119(e)(1) of provisional application Ser. No. 60/392,769, filed Jul. 1, 2002, by Suparna Datta-Bellamy, Anand G. Dabak and Timothy M. Schmidl.

BACKGROUND OF THE INVENTION

1. Field of the Invention

This invention relates generally to the shared control channel (HS-SCCH) for the HS-DSCH (high speed downlink shared channel) defined in technical standard 3GPP TS 25.212 for multiplexing and channel coding (FDD), developed within the $3^{rd}$ Generation Partnership Project, and more particularly to a technique for determining adaptive thresholds associated with HS-SCCH detection schemes.

2. Description of the Prior Art

Using fixed threshold values in HS-SCCH detection schemes has been shown to yield false alarm probabilities that increase with signal-to-noise ratio (SNR). Specifically, as the SNR increases, the Viterbi decoder metric increases. Consequently, the received signal is more likely to cross the threshold.

In view of the above, a technique for implementing adaptive thresholds associated with HS-SCCH detection schemes and that is robust to amplitude variations of the different shared control channels would be both advantageous and desirable.

SUMMARY OF THE INVENTION

The present invention is directed to a technique for implementing adaptive thresholds associated with HS-SCCH detection schemes; and when applied to any detection scheme, the resulting false alarm probability curves are more robust to amplitude variations of the different shared control channels. The technique has low computational complexity and low storage requirements for the estimator. Such lower complexity detection schemes have been found to outperform more complex schemes when adaptive thresholds are applied.

According to one embodiment, a high-speed shared control channel (HS-SCCH) detection method comprises the steps of estimating an amplitude value associated with a received signal on a shared control channel (SCCH); and scaling a desired threshold value by the estimated amplitude value to generate an adaptive threshold value there from, such that the adaptive threshold value is substantially robust to amplitude variations associated with at least one SCCH.

BRIEF DESCRIPTION OF THE DRAWINGS

Other aspects and features of the present invention and many of the attendant advantages of the present invention will be readily appreciated as the invention becomes better understood by reference to the following detailed description when considered in connection with the accompanying drawings in which like reference numerals designate like parts throughout the figures thereof and wherein.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
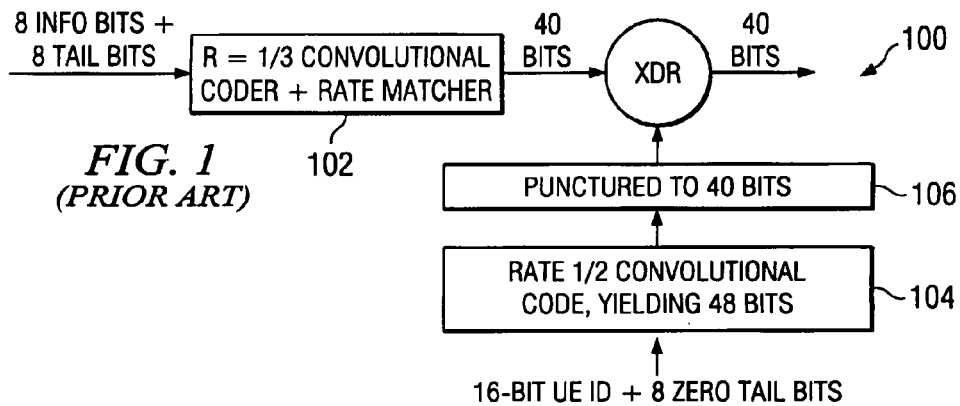
FIG. 1 is a flow diagram illustrating part I coding including a UE ID scrambler associated with the currently approved structure for the HS-SCCH.

The present embodiments are best understood with reference to FIG. 1, by first providing a background for the currently approved structure for the HS-SCCH that is broken up into 2 parts. Part I consists of 8 information bits including the CCS and the modulation level; while Part II contains 13 information bits and a 16-bit CRC. Looking now at FIG. 1, coding 100 for Part I consists of inputting the 8 information bits plus 8 tail bits into a rate ⅓ convolutional coder and rate-matching the output to 40 bits as shown in block 102. These encoded output bits are then scrambled by a 16-bit UE ID, which is extended to 40 bits via a punctured, rate ½ convolutional code as shown in blocks 104 and 106. These scrambled bits are carried entirely in the first slot 202 of the HS-SCCH transmission 200 shown in FIG. 2.

In Part II (enumerated 204 in FIG. 2), the CRC is scrambled by the 16-bit UE ID, after which all 29 bits plus 8 tail bits are convolutionally encoded by the rate ⅓ code. The resulting 111 output bits are rate-matched to 80 bits and transmitted over 2 slots. Rate-matching for both Part I and Part II is implemented using the following optimal puncturing patterns. For Part I, puncture bits 1, 2, 4, 8, 42, 45, 47, 48 (where the bit count ranges from 1 to 48). For Part II, puncture bits 1, 2, 3, 4, 5, 6, 7, 8, 12, 14, 15, 24, 42, 48, 54, 57, 60, 66, 69, 96, 99, 101, 102, 104, 105, 106, 107, 108, 109, 110, 111.

Figure 2:
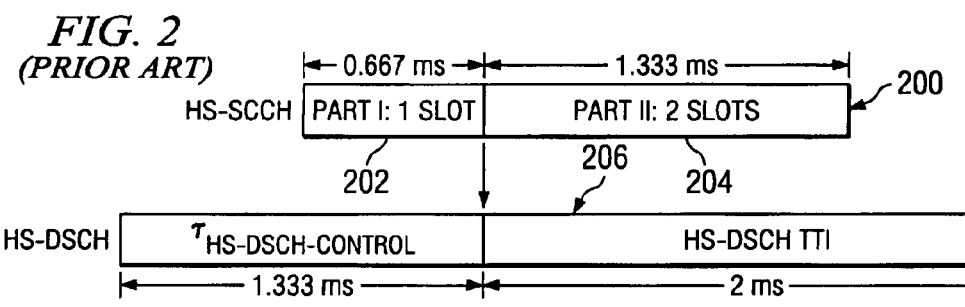
FIG. 2 is a timing diagram illustrating the relationship between HS-SCCH and HS-DSCH timing.

FIG. 2 is a timing diagram illustrating the relationship between HS-SCCH 200 and HS-DSCH 206 timing. The total number of HS-SCCH's 200 can range from one to four, with all the UE's trying to decode Part I of all the SCCH's 200. The decoding process (for each SCCH) consists of first descrambling the bits with its unique ID, and then sending those bits through the convolutional decoder. Because there is no CRC for Part I, each UE needs to have some kind of detection mechanism to determine whether or not to buffer and decode Part II. The performance metrics that this detection mechanism needs to address are: probability of miss ($p_{miss}$) and probability of false alarm ($p_{fa}$).

A miss event occurs when an SCCH transmission 200 is intended for a UE, and yet the UE fails to realize this and does not proceed to decode Part II. This is a serious occurrence that will result in a loss of throughput and wasted resources. Consequently, these types of error events should most preferably be minimized to the order of 1-2%.

A false alarm event occurs when a UE incorrectly determines that a transmission was intended for itself and proceeds to decode Part II 204 on that SCCH 200. The consequence in this case is false buffering and increased power consumption. Note that because Part II has a strong 16-bit UE specific CRC, it is unlikely that this type of error will result in any HARQ (hybrid automatic repeat request) combining loss.

In view of the foregoing, the present inventors then examined six detection schemes, including:

1. Absolute Viterbi Metric (AVM);

2. AVM+1 Re-Encode;

3. Yamamoto-Itoh Algorithm (YI)+Minimum Path Metric Difference (MPMD);

4. AVM+YI;

5. AVM+YI+1 Re-Encode; and

6. Re-Encoded Symbol Error Rate (SER).

The Absolute Viterbi Metric (AVM) has the UE choose the SCCH with the largest Viterbi metric. If that metric is greater than some threshold value, then the UE determines that the SCCH is right for it.

AVM+1 Re-Encode entails first choosing the SCCH with the largest Viterbi metric. Next, re-encode the decoded bits of that SCCH. If less than some threshold number of bits disagrees with the original (hard) received symbols, then the UE determines that the SCCH is right for it.

The basic idea behind the Yamamoto-Itoh algorithm is that whenever two merging paths in the Viterbi decoding trellis are very close in terms of path metric, the survivor path is more likely to be in error. So, the YI algorithm sets a threshold on the path metric difference (PMD) between the two largest merging paths at each state in the trellis. If the difference is less than the threshold, then the surviving path is labeled "bad". If, at the end of Viterbi decoding, any leg of the final surviving path is "bad", then the transmission is declared a failure. In the case where more than one of the four transmissions has a "good" surviving path, the secondary soft metric Minimum Path Metric Difference (MPMD) is used. While decoding, we keep track of the minimum path metric difference for all four channels. If the YI algorithm yields a tie between more than one SCCH, then we choose the channel with the maximum MPMD.

AVM+YI involves first choosing the SCCH with the largest Viterbi metric. If the YI algorithm labels that surviving path "good", then the UE determines that the SCCH is right for it; otherwise the transmission is declared a failure.

AVM+YI+1 Re-Encode requires first completing AVM+YI. If the SCCH passes the YI test, then perform a re-encode of the decoded bits. If less than some threshold number of bits disagrees with the original (hard) received symbols, then the UE determines that the SCCH is right for it.

The SER metric entails performing the Re-Encode metric for all for four SCCH's. The UE compares the number of errors to a threshold to determine which (if any) of the transmissions was right for it.

While studying the foregoing detection schemes, an issue of concern was discovered by the present inventors to lie with using fixed threshold values. Specifically, the Viterbi metric was found to increase as the SNR increases. The received signal is therefore more likely to cross the threshold, thus leading to a worse false alarm probability at high SNR values. To counter this, the present inventors decided to investigate the use of adaptive thresholds that are based on estimating the (QPSK) amplitude of the received signals. One adaptive technique is now described below as follows:

Let the received bits on a shared control channel after despreading be indicated by the vector $$r = \{r_I^1 + j^* r_Q^1, \ldots, r_I^{40} + j^* r_Q^{40}\} \text{ (complex } I, Q\text{)}.$$

Noticeably, there are up to four shared control channel vectors similar to the one defined above. Then the received signal is normalized by the estimate $$\hat{A} = \sqrt{2} * \left( \frac{\sum_{i=1}^{40} |r_I^i| + |r_Q^i|}{(2*40)} \right).$$

That is, we generate a new vector $\tilde{r} = r/\hat{A}$ and pass it to the Viterbi decoder. In this way, the thresholds are now effectively adaptive and are robust to amplitude variations of the different shared control channels. Other normalization algorithms like using the Euclidean metric instead of the absolute can also be used to normalize the amplitude of the received signal. In this case, we would have $$\hat{A} = \left( \frac{\sqrt{\left(\sum_{i=1}^{40} |r_I^i|^2 + |r_Q^i|^2\right)^2 / 40}}{2} \right).$$

Figure 3:
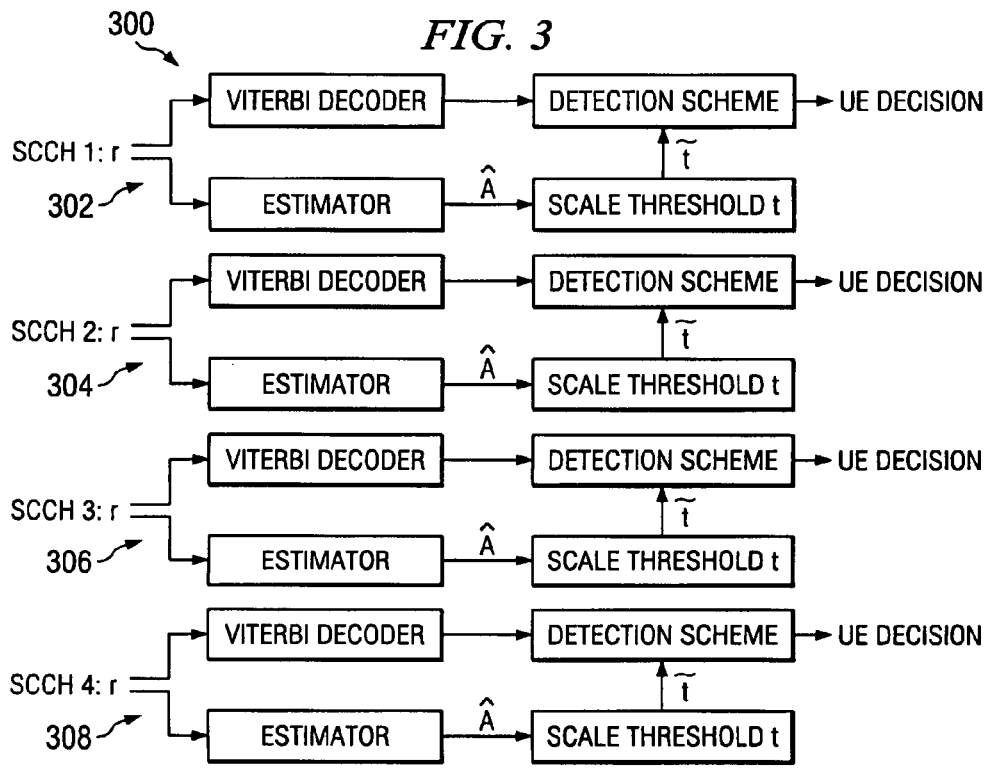
FIG. 3 is a block diagram illustrating an adaptive threshold calculation technique associated with four shared control channels according to one embodiment of the present invention.

Alternatively, rather than buffering and normalizing the received signal, we can instead compute the estimate $\hat{A}$ as the received bits enter the Viterbi decoder and then scale the threshold value t by the final result such as seen in FIG. 3 that is a block diagram illustrating an adaptive threshold calculation technique 300 associated with four shared control channels 302 304 306, 308 according to one embodiment of the present invention. That is, we generate the new adaptive threshold value $\tilde{t} = t^* \hat{A}$.

Figure 4:
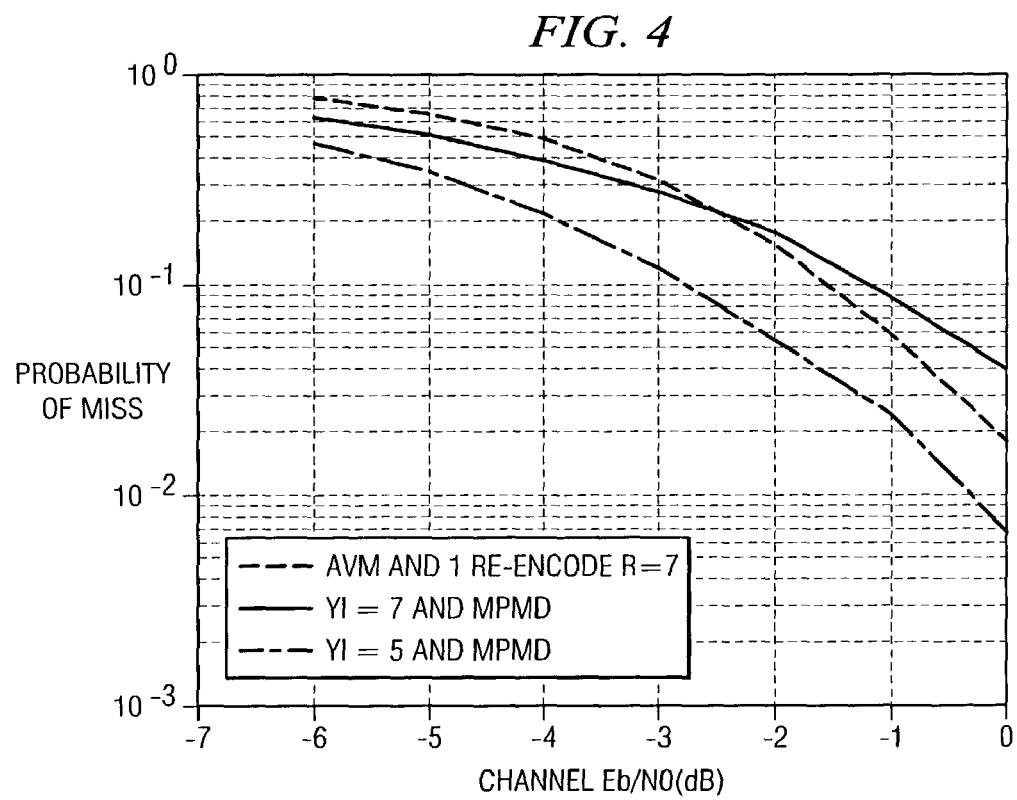
FIG. 4 is a graph illustrating simulated miss-probability plots associated with a plurality of detection schemes using adaptive threshold values.
Figure 5:
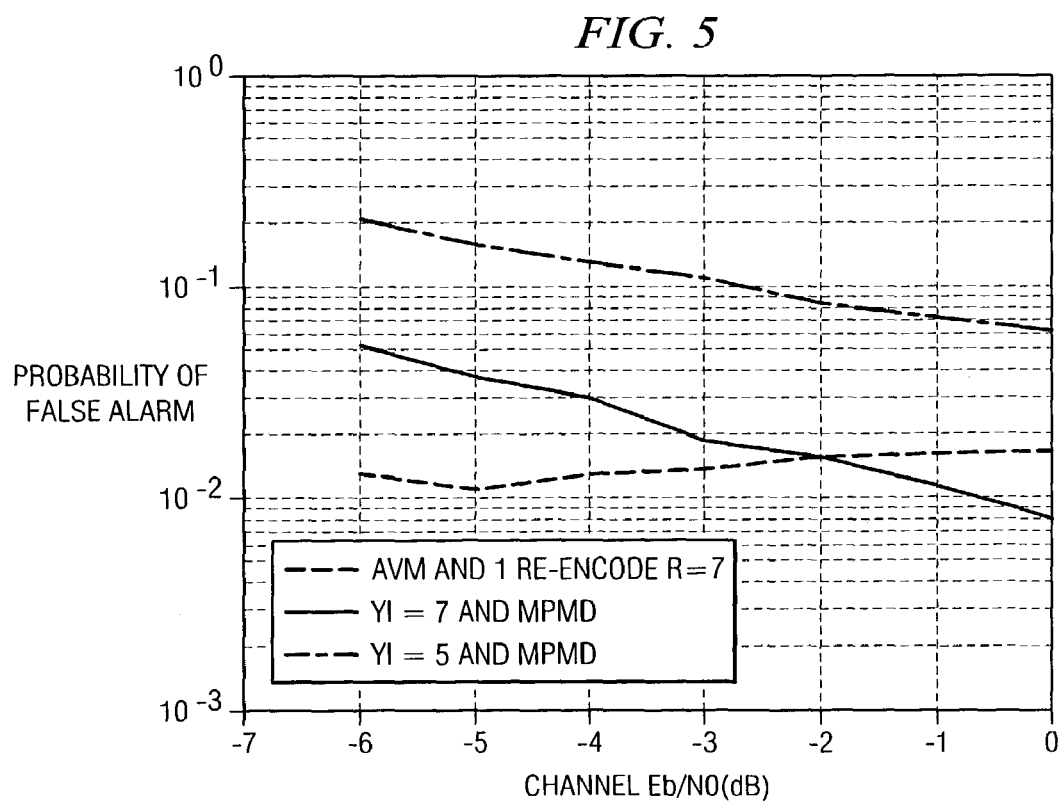
FIG. 5 is a graph illustrating simulated false alarm probability plots associated with a plurality of detection schemes using adaptive threshold values.

The present inventors ran simulations for all of the various detection schemes discussed herein before, for several threshold values (both fixed and adaptive). The best results were found to be those for the AVM+I Re-Encode and the YI+MPMD detection schemes using adaptive thresholds as seen in FIGS. 4-5; wherein FIG. 4 is a graph illustrating simulated miss-probability plots associated with a plurality of detection schemes using adaptive threshold values; and FIG. 5 is a graph illustrating simulated false alarm probability plots associated with a plurality of detection schemes using adaptive threshold values. For the three cases shown, the best balance of results was achieved with the AVM+1 Re-Encode approach.

Comparing these results with other known detection schemes, the present inventors recommend most preferably utilizing the AVM+1 Re-Encode AVM+1 Re Encode detection scheme with adaptive threshold value $t_{adaptive} = 7$. This method was found to not only yield comparable $p_{miss}$ and better $P_{fa}$ curves as shown in Table 1 below, but to also require less computational complexity and storage requirements than other known schemes as seen in Table 2, also shown below. The present inventors also noted that because one known detection scheme uses a fixed threshold value for the simulations, the respective $P_{fa}$ curves actually increase beyond the 0 dB point, whereas the inventive results remain flat (due to the re-encoding).

TABLE 1

Performance of Detection Mechanisms

| Detection Scheme | $P_{miss}$ (at 0 dB channel $E_b/N_0$) | $P_{FA}$ (at 0 dB channel $E_b/N_0$) |
|---|---|---|
| AVM + 1 Re-Encode (t adaptive = 7) | 1.8% | 1.6% |
| YI + MPMD (t adaptive = 5) | .66% | 6% |
| YI + MPMD (t adaptive = 7) | 4% | .8% |
| Known scheme 1: YI + MPMD (t = 22) | 1% | 2% *increasing |
| Known scheme 2: YI + MPMD + SER | 4% | .6% |

TABLE 2

Complexity of Detection Schemes

| Detection scheme | Adds/subtracts | Multiplies | Comparisons | Logical & | Storage |
|---|---|---|---|---|---|
| AVM + 1 Re-Encode with adaptive threshold | 700 adds | 8 | 40 (bit) | 432 | 164 (160 bit, 4 real) |
| YI + MPMD | 8192 subtracts | None | 8220 (real) | None | 2048 (1024 bit, 1024 real) |
| YI + MPMD with adaptive threshold | 8508 (316 adds, 8192 subtracts) | 8 | 8220 (real) | None | 2052 (1024 bit, 1028 real) |
| YI + MPMD + SER | 9728 (1536 adds, 8192 subtracts) | None | 8380 (8220 real, 160 bit) | 1728 | 2048 (1024 bit, 1024 real) |
| Absolute Viterbi Metric | None | None | None | None | None |
| AVM + 1 Re-Encode | 384 adds | None | 40 (bit) | 432 | 160 bit |
| YI + MPMD | 8192 subtracts | None | 8220 (real) | None | 2048 (1024 bit, 1024 |
| YI | 8192 subtracts | None | 8192 (real) | None | 1024 bit (path labels |
| MPMD | None | None | 28 (real) | None | 1024 real (PMDs) |
| AVM + YI | 8192 subtracts | None | 8192 (real) | None | 1024 bit (path labels) |
| AVM + YI + 1 Re-Encode | 8576 (384 adds, 8192 subtracts) | None | 8232 (8192 real, 40 bit) | 432 | 1184 bit |
| SER | 1536 adds | None | 160 (bit) | 1728 | 160 bit |
| YI + MPMD + SER | 9728 (1536 adds, 8192 subtracts) | None | 8380 (8220 real, 160 bit) | 1728 | 2208 (1184 bit, 1024 real) |
| Estimator | 316 adds | 8 | None | None | 4 real |
| YI + MPMD with adaptive threshold | 8508 (316 adds, 8192 subtracts) | 8 | 8220 (real) | None | 2052 (1024 bit, 1028 real) |
| AVM + 1 Re-Encode with adaptive threshold | 700 adds | 8 | 40 (bit) | 432 | 164 (160 bit, 4 real) |

This invention has been described in considerable detail in order to provide those skilled in the HS-SCCH detection scheme art with the information need to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A shared control channel (SCCH) detection method comprising the steps of:
    descrambling a plurality of bits of a received signal on the SCCH with a sequence generated by convolutional encoding and puncturing a user identification signal to produce a plurality of descrambled bits;
    estimating an amplitude value in a transceiver associated with the descrambled bits on the SCCH; and
    scaling a desired threshold value by the estimated amplitude value to generate an adaptive threshold value there from, such that the adaptive threshold value is substantially robust to amplitude variations associated with at least one SCCH.

2. The method according to claim 1 wherein the step of estimating an amplitude value associated with the descrambled bits on the SCCH comprises estimating a desired metric associated with the received signal on the SCCH.

3. The method according to claim 2 wherein the step of scaling a desired threshold value by the estimated amplitude value to generate an adaptive threshold value there from, such that the adaptive threshold value is substantially robust to amplitude variations associated with at least one SCCH comprises normalizing the descrambled bits by the estimated desired metric.

4. The method according to claim 3 further comprising the step of passing the normalized descrambled bits to a Viterbi decoder, such that the desired adaptive threshold is substantially robust to amplitude variations associated with at least one SCCH.

5. The method according to claim 2, wherein the step of estimating a desired metric associated with the descrambled bits on the SCCH comprises the steps of:
- determining absolute values associated with at least one data signal;
- accumulating the absolute values; and
- determining the estimated desired metric in response to the accumulated absolute values.

6. The method according to claim 5 further comprising the steps of:
- decoding the descrambled bits via a Viterbi decoder and generating a decoded signal there from; and
- detecting the decoded signal to determine whether an adaptive threshold condition associated with the adaptive threshold value has been met, wherein the adaptive threshold value is substantially robust to amplitude variations associated with at least one SCCH.

7. The method according to claim 1 wherein the step of scaling a desired threshold value by the estimated amplitude value to generate an adaptive threshold value there from, such that the adaptive threshold value is substantially robust to amplitude variations associated with at least one SCCH, comprises the steps of:
- setting a threshold value on the path metric difference between the two largest merging paths at each state in a Viterbi decoding trellis; and
- scaling each pat metric difference threshold value by the estimated amplitude value to determine the presence of a surviving path.

8. A shared control channel (SCCH) detection method comprising the steps of:
- descrambling a plurality of bits of a received signal on the SCCH with a sequence generated by convolutional encoding and puncturing a user identification signal to produce a plurality of descrambled bits;
- estimating an amplitude value in a transceiver associated with the descrambled bits; and
- scaling a desired threshold value by the estimated amplitude value to generate an adaptive threshold value for the SCCH.

9. A shared control channel (SCCH) detection method comprising the steps of:
- receiving a shared control channel vector in a transceiver, the shared control channel vector scrambled by a sequence generated by convolutional encoding and puncturing a user identification signal:
- descrambled the shared control channel vector to produce a plurality of descrambled bits;
- normalizing the descrambled bits; and
- applying the normalized descrambled bits to a Viterbi decoder.

* * * * *